(12) United States Patent
Kyles (10) Patent No.: US 8,284,888 B2
(45) Date of Patent: Oct. 9, 2012

(54) FREQUENCY AND PHASE ACQUISITION OF A CLOCK AND DATA RECOVERY CIRCUIT WITHOUT AN EXTERNAL REFERENCE CLOCK

(76) Inventor: Ian Kyles, West Linn, OR (US)

( * ) Notice: Subject to any disclaimer, the term of this patent is extended or adjusted under 35 U.S.C. 154(b) by 163 days.

(21) Appl. No.: 12/687,410

(22) Filed: Jan. 14, 2010

(65) Prior Publication Data

US 2011/0169535 A1    Jul. 14, 2011

(51) Int. Cl.
*H03D 3/24* (2006.01)
(52) U.S. Cl. ........ 375/376; 375/316; 375/326; 375/340; 375/354; 375/371; 375/375; 370/503; 370/508; 370/509; 370/510; 370/511; 370/512; 370/513; 370/514; 455/260; 455/502; 455/516; 327/141; 327/147; 327/156; 714/707; 329/361; 341/122
(58) Field of Classification Search ............. 375/316, 375/326, 340, 354, 371, 375, 376; 370/503, 370/508, 509, 510, 511, 512, 513, 514; 455/260, 455/502, 516; 327/141, 147, 156; 714/707; 329/361; 341/122
See application file for complete search history.

(56) References Cited

U.S. PATENT DOCUMENTS

| | | | |
|---|---|---|---|
| 4,218,771 A | 8/1980 | Hogge, Jr. | |
| 4,633,465 A | 12/1986 | Fitch et al. | |
| 5,295,155 A | 3/1994 | Gersbach et al. | |
| 5,469,466 A | 11/1995 | Chu | |
| 5,533,072 A | 7/1996 | Georgiou et al. | |
| 5,598,439 A | 1/1997 | Wagner | |
| 5,610,953 A | 3/1997 | Betts et al. | |
| 5,717,728 A | 2/1998 | Hein et al. | |
| 6,347,128 B1 | 2/2002 | Ransijn | |
| 6,463,109 B1 | 10/2002 | McCormack et al. | |
| 6,950,375 B2 | 9/2005 | Duffner et al. | |
| 6,981,168 B2 | 12/2005 | Schmatz et al. | |
| 6,996,202 B2 | 2/2006 | McCormack et al. | |
| 7,092,466 B2 | 8/2006 | Hwang et al. | |
| 7,136,443 B2 | 11/2006 | Vallet et al. | |
| 7,149,269 B2 | 12/2006 | Cranford, Jr. et al. | |
| 7,206,368 B2 | 4/2007 | Engel et al. | |
| 7,251,296 B2 * | 7/2007 | Kennedy et al. | 375/327 |
| 7,260,145 B2 | 8/2007 | Blanc et al. | |
| 7,339,853 B2 | 3/2008 | Srikantam et al. | |
| 7,389,450 B2 | 6/2008 | Fleischer-Reumann et al. | |
| 7,450,677 B2 | 11/2008 | Yu et al. | |
| 7,493,530 B2 | 2/2009 | Tan | |

(Continued)

OTHER PUBLICATIONS

International Search Report on corresponding PCT application (PCT/US2011/021366) from International Searching Authority (KIPO) dated Aug. 29, 2011.
Written Opinion on corresponding PCT application (PCT/US2011/021366) from International Searching Authority (KIPO) dated Aug. 29, 2011.

(Continued)

*Primary Examiner* — Leon Flores
(74) *Attorney, Agent, or Firm* — Klein, O'Neill & Singh, LLP (57) ABSTRACT

A clock and data recovery device receives a serial data stream and produces recovered clock and data signals. The clock and data recovery device operates over a range of frequencies and without use an external reference clock. A first loop supplies a first clock signal to a second loop. The second loop modifies the first clock signal to produce the recovered clock signal and uses the recover clock signal to produce the recovered data signal. The first loop changes the frequency of the first clock signal based on frequency comparison and data transition density metrics.

10 Claims, 7 Drawing Sheets

U.S. PATENT DOCUMENTS

| | | | |
|---|---|---|---|
| 7,643,576 | B2 | 1/2010 | Lai et al. |
| 7,684,478 | B2 | 3/2010 | Cranford, Jr. et al. |
| 7,697,649 | B2 | 4/2010 | Okamura |
| 7,721,134 | B2 | 5/2010 | Cranford, Jr. et al. |
| 7,778,375 | B2 * | 8/2010 | Lu .................................. 375/375 |
| 7,783,935 | B2 | 8/2010 | Thayer |
| 7,812,749 | B2 | 10/2010 | Abel et al. |
| 7,822,114 | B2 | 10/2010 | Bulzacchelli et al. |
| 7,855,969 | B2 | 12/2010 | Vogel et al. |
| 7,885,365 | B2 | 2/2011 | Hagleitner et al. |
| 7,916,820 | B2 | 3/2011 | Cranford, Jr. et al. |
| 2004/0268190 | A1 | 12/2004 | Kossel et al. |
| 2005/0058235 | A1 * | 3/2005 | Beeson et al. ................ 375/376 |
| 2005/0135518 | A1 | 6/2005 | Vallet et al. |
| 2006/0078079 | A1 | 4/2006 | Lu |
| 2006/0222123 | A1 | 10/2006 | Mobin et al. |
| 2007/0052460 | A1 | 3/2007 | Mobin et al. |
| 2007/0156360 | A1 | 7/2007 | Romero |
| 2007/0268962 | A1 | 11/2007 | Mobin et al. |
| 2007/0271052 | A1 | 11/2007 | Abel et al. |
| 2008/0101524 | A1 | 5/2008 | Jeong et al. |
| 2010/0046683 | A1 | 2/2010 | Beukema et al. |
| 2010/0329322 | A1 | 12/2010 | Mobin et al. |
| 2010/0329325 | A1 | 12/2010 | Mobin et al. |

OTHER PUBLICATIONS

Bulzacchelli et al., "A 10-Gb/s 5-Tap DFE/4-Tap FFE Transceiver in 90-nm CMOS Technology," IEEE Journal of Solid-State Circuits, vol. 41, No. 12, Dec. 2006.

Miller, Christopher M., "High-Speed Digital Transmitter Characterization Using Eye Diagram Analysis," Hewlett-Packard Journal, vol. 45, No. 4, Aug. 1994.

Momtaz et al., "A Fully Integrated 10-Gb/s Receiver with Adaptive Optical Dispersion Equalizer in 0.13-μm CMOS," IEEE Journal of Solid-State Circuits, vol. 42, Issue 4, pp. 872-880, Apr. 2007.

Noguchi et al., "A 40-Gb/s CDR Circuit With Adaptive Decision-Point Control Based on Eye-Opening Monitor Feedback," IEEE Journal of Solid-State Circuits, vol. 43, No. 12, Dec. 2008.

Stojanović et al., "Adaptive Equalization and Data Recovery in a Dual-Mode (PAM2/4) Serial Link Transceiver," IEEE Symposium on VLSI Circuits, Honolulu, HI, Jun. 17-19, 2004.

Stojanović et al., "Autonomous Dual-Mode (PAM2/4) Serial Link Transceiver With Adaptive Equalization and Data Recovery," IEEE Journal of Solid-State Circuits, vol. 40, No. 4, Apr. 2005.

Yang et al., "A 0.5-μm CMOS 4.0-Gbit/s Serial Link Transceiver with Data Recovery Using Oversampling," IEEE Journal of Solid-State Circuits, vol. 33, Issue 5, pp. 713-722, May 1998.

* cited by examiner

FREQUENCY AND PHASE ACQUISITION OF A CLOCK AND DATA RECOVERY CIRCUIT WITHOUT AN EXTERNAL REFERENCE CLOCK

BACKGROUND OF THE INVENTION

The present invention relates generally to clock and data recovery circuits and, more particularly, to clock and data recovery circuits operable without an external reference clock.

Although processing circuitry often processes data in a parallel manner, the data are often communicated between points serially. Serial data may be transmitted without an explicit clock signal, for example, using a non-return-to-zero format. A receiver receiving the serial signal works to recover the transmitted data and a corresponding clock signal, with circuitry of the receiver performing such operations often termed a clock and data recovery circuit or more commonly a CDR.

Many clock and data recovery circuits use a reference clock signal in their operation, for example, to aid in clock recovery by having a reference clock signal with a frequency close to the data rate. The reference clock signal often comes from a reference clock in the form of a crystal oscillator or similar precision source. Provisioning of the reference clock may be expensive, occupy a large space, or have other undesirable impacts.

In some applications, serial data may be received at varying rates. In such applications, a CDR may be provided with multiple reference clock signals, one for each data rate, sourced from multiple reference clocks. This may substantially increase the expense of or space required for clock and data recovery circuits using reference clock signals.

BRIEF SUMMARY OF THE INVENTION

The invention accordingly provides circuits and methods for clock and data recovery without reference clock signals.

In one aspect the invention provides a clock and data recovery device including an oscillator configured to produce a first clock signal in response to a frequency control signal; clock circuitry configured to receive the first clock signal and produce an output clock signal based on a phase control signal; a phase detector configured to receive a data input signal and the output clock signal and produce a data output signal and a phase detection signal; a loop filter configured to produce the phase control signal by filtering the phase detection signal; and a controller configured to control the frequency of the oscillator using the frequency control signal based on measurements of the first clock signal, the output clock signal, and the data input signal.

In another aspect the invention provides a clock and data recovery device including an oscillator configured to produce a first clock signal having a plurality of phases with an oscillation frequency based on a frequency control signal and a range control signal; a controller configured to produce the frequency control signal, the range control signal, and a prescaler control signal based on a frequency comparison measure and a data transition density measure; a phase interpolator configured to receive the first clock signal and produce a second clock signal based on a phase control signal, where the second clock signal is interpolated from two phases of the plurality of phases of the first clock signal; a prescaler configured to receive the second clock signal and produce an output clock signal by dividing the second clock signal by a value of the prescaler control signal; a phase detector configured to receive a data input signal and the output clock signal and produce a data output signal and a phase detection signal; a loop filter configured to produce the phase control signal by filtering the phase detection signal; a frequency comparison module configured to produce the frequency comparison measure based on relative frequencies of the first clock signal and the output clock signal; and a transition density detector configured to produce the data transition density measure based on relative frequencies of the data input signal and the output clock signal.

In another aspect the invention provides a clock and data recovery device including an oscillator configured to produce a first clock signal in response to a first frequency control signal and second frequency control signal; a divider configured to receive the first clock signal and produce an output clock signal; a phase detector configured to receive a data input signal and the output clock signal and produce a data output signal and a phase detection signal; a loop filter configured to produce the second frequency control signal by filtering the phase detection signal; and a controller configured to control the frequency of the oscillator using the frequency control signal based on measurements of the first clock signal, the output clock signal, and the data input signal.

In another aspect the invention provides a method for clock and data recovery including measuring a frequency comparison indicative of the relative frequencies of a first clock signal and an output clock signal; measuring a data transition density indicative of the transition density of a data input signal relative to the frequency of the output clock signal; searching for circuit settings that allow locking of a digital clock and data recovery circuit to the serial data signal, where the locking is based on the measured frequency comparison and the measured data transition density.

These and other aspects of the invention are more fully comprehended upon review of this disclosure.

DETAILED DESCRIPTION

Figure 1:
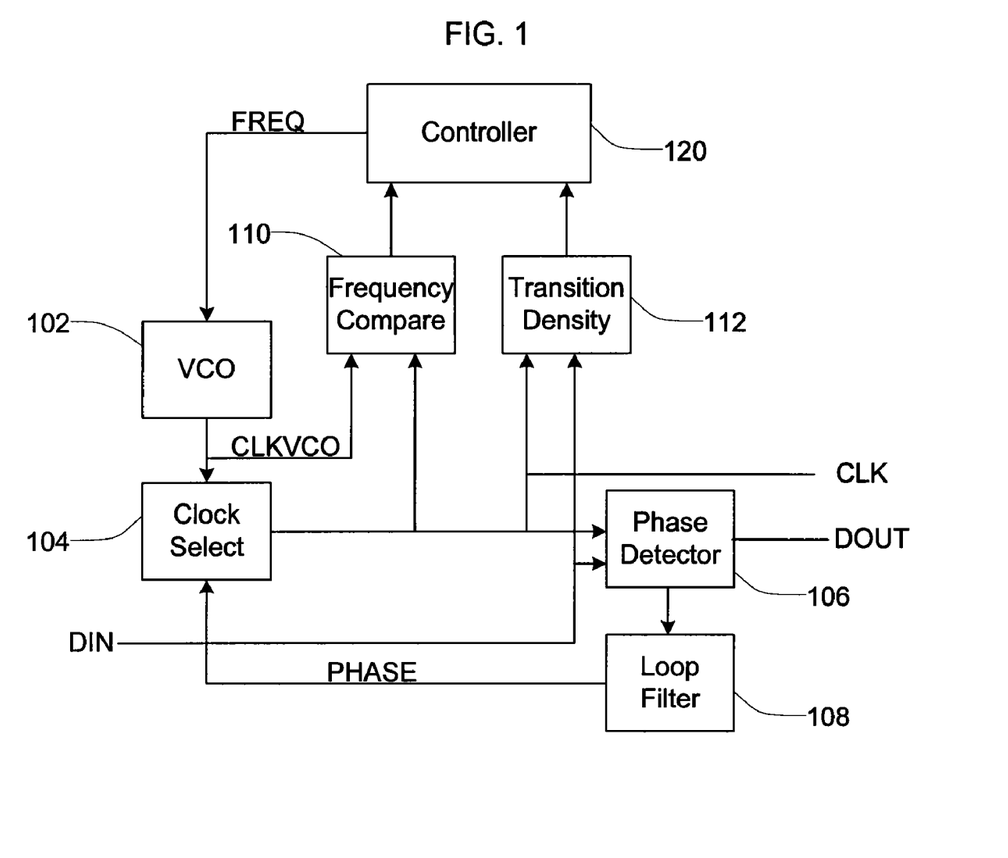
FIG. 1 is a block diagram of a clock and data recovery circuit in accordance with aspects of the invention.

FIG. 1 is a block diagram of a clock and data recovery circuit (CDR) in accordance with aspects of the invention. The CDR receives a serial input signal DIN that conveys a sequential stream of data bits from which the CDR produces an output data signal DOUT and an associated CDR output clock signal CLK. The CDR operates to produce the output data signal DOUT so that values in the output data signal DOUT substantially match values used by a transmitter to produce the serial input signal DIN and to produce the CDR output clock signal CLK synchronized with the output data signal DOUT. When CDR operation is synchronized to the serial input signal, it is said to be locked.

The CDR of FIG. 1 receives the serial input signal DIN at any data rate selected from a range of operating data rates. For example, in some embodiments, depending possibly on what communication protocol is selected by the source of the serial input signal DIN, data may be received at any of 3.125 Gbits/s, 3.175 Gbits/s, 6.25 Gbits/s, or 6.375 Gbits/s. In such embodiments, the CDR adjusts its operation to match the rate at which data are received. Preferably, the CDR operates without external signaling, for example, an externally supplied reference clock signal or data rate indicator. Additionally, the data rate may vary gradually over time, for example, changing by tens of parts per million over millions of clock cycles. The CDR tracks such timing changes by detecting changes in data rate and making corresponding changes in clock rates of the CDR.

The CDR includes a first timing loop and a second timing loop, with a clock signal generated from a common node of the two loops. The first timing loop may be considered to set a coarse frequency of the clock signal and the second timing loop may be considered to set a fine frequency of the clock signal. Generally, the first loop adjusts the frequency of the common clock signal to approximately match a received data rate but with steps that may be too widely spaced for successful data recovery. The second loop further adjusts the frequency of the common clock signal with sufficiently fine steps for successful data recovery.

The first timing loop includes, in an embodiment illustrated in FIG. 1, a voltage-controlled oscillator 102 that produces a VCO clock signal CLKVCO based on a frequency control signal FREQ. A clock selector 104 utilizes the VCO clock signal CLKVCO and a phase control signal PHASE from the second timing loop to produce the CDR output clock signal CLK. A frequency comparator 110 and a transition density detector 112 produce measurements that a controller 120 utilizes in adjusting the frequency control signal FREQ and thereby the frequency at which the voltage-controlled oscillator 102 oscillates.

The second timing loop includes the clock selector 104, which is also included in the first timing loop, that receives the phase control signal PHASE from a loop filter 108. The loop filter 108 produces the phase control signal PHASE by filtering phase comparisons of the CDR output clock signal CLK and the serial input signal DIN from a phase detector 106. The phase detector 106 receives the serial input signal DIN and the CDR output clock signal CLK and additionally produces the output data signal DOUT.

The first and second timing loops operate in an interconnected manner to recover clock and data from the serial input signal DIN. The first timing loop is independently operable over a wide frequency range, for example, several octaves, and produces the VCO clock signal CLKVCO for use by the second timing loop. The first timing loop adjusts the frequency of the VCO clock signal CLKVCO to have a frequency that enables the second timing loop to recover clock and data from the serial input signal DIN. The second timing loop adapts how it utilizes the clock signal from the first timing loop based on the relative timing of the CDR output clock signal CLK and the serial input signal DIN. The adaptation is made to synchronize, in frequency and phase, the CDR output clock signal CLK and the serial input signal DIN. In some embodiments, the frequency adjustment range of the second timing loop is narrow, for example, five percent, in comparison to the range of the first timing loop.

In more detail, the voltage-controlled oscillator 102 produces the VCO clock signal CLKVCO oscillating at a frequency controlled by the value of the frequency control signal FREQ. In some embodiments, the VCO clock signal CLKVCO has a plurality of phases, for example, phases with 45° relationships. In some embodiments, the frequency control signal FREQ signals a digital representation of a desired clock signal frequency, for example, in hertz. Other embodiments may use an analog representation, for example, a voltage or current. In other embodiments, the frequency control signal FREQ may signal a desired clock signal frequency indirectly, for example, with a divide value. Although the frequency of the VCO clock signal CLKVCO is controlled by the frequency control signal FREQ, the relationship may be inaccurate and may change over time.

The clock selector 104 receives the VCO clock signal CLKVCO and the phase control signal PHASE from the loop filter 108 and produces the CDR output clock signal CLK. In some embodiments, the clock selector 104 produces the CDR output clock signal CLK so that its next edge follows the previous edge by a number of cycles of the VCO clock signal CLKVCO signaled by the value of the phase control signal PHASE. That is, the phase control signal PHASE may signal the number of cycles of the VCO clock signal CLKVCO in one cycle of the CDR output clock signal CLK. For example, when the phase control signal PHASE has a value of 4.5, the next edge of the CDR output clock signal CLK will be 4.5 cycles after the previous edge of the CDR output clock signal CLK. In some embodiments, the phase control signal PHASE is limited to positive integer values, and the clock selector 104 operates as a multi-modulus divider. The phase control signal PHASE may change on a regular basis, for example, every period of the CDR output clock signal CLK.

The frequency comparator 110 receives the VCO clock signal CLKVCO and the CDR output clock signal CLK and produces a frequency comparison measurement for use by the controller 120. The frequency comparison measurement may be a ratio, an offset, or a combination of ratio and offset. In some embodiments, the frequency comparator 110 counts the number of cycles of one of the clock signals being compared that occur within a set number of cycles of the other clock signal being compared. For example, the frequency comparator 110 may count the number of cycles of the VCO clock signal CLKVCO that occur within 1000 cycles of the CDR output clock signal CLK. A count of 200, for example, would correspond to a frequency ratio of 0.2. The number of clock signal cycles may be approximated with integer precision by counting rising or falling edges of the clock signal. When the second timing loop is locked to the serial input signal DIN, the frequency comparison measurement is a measure of the frequency of the VCO clock signal CLKVCO relative to the data rate of the serial input signal DIN.

The transition density detector 112 receives the CDR output clock signal CLK and the serial input signal DIN and produces a transition density measurement for use by the controller 120. The transition density measurement is representative of how often the serial input signal DIN changes relative to the frequency of the CDR output clock signal CLK. Since the rising and falling edges of a binary signal predictably alternate, the transition density may be accurately estimated by measuring the density of rising or falling edges. In one embodiment, the transition density detector 112 counts the number of edges of the serial input signal DIN during a set number of cycles of the CDR output clock signal CLK. For example, the transition density detector 112 may count the number of rising edges of the serial input signal DIN that occur within 1000 cycles of the CDR output clock signal CLK. A count of 400, for example, would correspond to a transition density of 0.8 after doubling to account for falling edges. The transition density is useful in detecting whether the CDR is locked by comparing the measured transition density to an expected transition density. The expected transition density varies with the method used produce the serial data. For example, an equiprobable, uncorrelated bit stream has a transition density of 0.5, and a bit stream from a common 8b10b encoder has a transition density of approximately 0.65. A transition density measurement substantially lower than the expected transition density indicates that the CDR is not locked to the serial input signal DIN and may be used by the controller 120 to determine that the voltage-controlled oscillator 102 should oscillate at a lower frequency. A transition density measurement substantially higher than the expected transition density indicates that the CDR is not locked to the serial input signal DIN and may be used by the controller 120 to determine that the voltage-controlled oscillator 102 should oscillate at a higher frequency.

The controller 120 adjusts the frequency of the voltage-controlled oscillator 102 based on the frequency comparison measurement and the transition density measurement. In some embodiments, the controller 120 may receive additional signals, for example, a loss-of-signal indicator or reset signal. The controller 120 may include custom circuitry, programmable circuitry, a programmable processor with software, or a combination thereof.

The controller 120 operates to determine a value for the frequency control signal FREQ at which the second timing loop locks to the incoming data. The controller 120 may determine that the second timing loop is locked to the incoming data when the value of the transition density measurement is close to the statistically expected value. For example, in one embodiment, when the statistically expected value for the transition density is 0.65, the controller 120 may determine that the second timing loop is locked when the transition density measurement is between 0.55 and 0.75.

In some embodiments, the controller 120 additionally operates to determine a value for the frequency control signal FREQ so that the second timing loop operates close to a center point of its adjustment range. The controller 120 may use the value of the frequency comparison measurement to judge closeness to the center point. For example, in an embodiment where the clock selector 104 operates as a multi-modulus divider with divide values of 18, 19, and 20, the controller 120 may determine that the second timing loop is operating close to the center point when the frequency comparison measurement is between 0.0536 and 0.0546.

The controller 120, in one embodiment, initially searches for a value of the frequency control signal FREQ that results in desired frequency comparison and transition density values by sweeping the frequency control signal FREQ through a range of possible values. In another embodiment, the controller 120 uses successive approximation to search for a desired value for the frequency control signal FREQ. The desired value may be one that results in the CDR locking to the input signal and the second timing loop operating near the center of its operating range.

The controller 120 may additionally track the serial input signal to maintain lock to the serial input signal. While tracking, the controller 120 may adjust the frequency control signal FREQ to maintain desired operating conditions. For example, the controller 120 may increase or decrease the frequency control signal FREQ when the frequency comparison measurement is higher or lower, respectively, than desired.

The controller 120 may additionally hold a value of the frequency control signal FREQ in response to interruptions in the serial input signal. In one embodiment, interruptions in the serial input signal may be indicated by a loss-of-signal sensor, which may be based, for example, on low received signal power. In another embodiment, interruptions in the serial input signal may be based on a very low transition density measurement. While holding, the controller maintains the frequency control signal FREQ value constant until the serial input signal returns and is no longer interrupted.

The phase detector 106 receives the serial input signal DIN and the CDR output clock signal CLK and produces the output data signal DOUT and a phase comparison signal. The phase detector 106 produces the output data signal DOUT by sampling the serial input signal DIN with the CDR output clock signal CLK. In some embodiments, the phase detector 106 clocks the serial input signal DIN into a flip-flop clocked by the CDR output clock signal CLK to produce the output data signal DOUT. There may be additional flip-flops between the data input and output, for example, to reduce metastability issues.

The phase comparison signal from the phase detector 106 is an indication of the timing of the serial input signal DIN in comparison to the timing of the CDR output clock signal CLK. In some embodiments, the phase detector 106 includes a Hogge or Alexander type phase detector. The phase comparison signal may include a pair of signals to indicate whether the CDR output clock signal CLK is early or late in comparison to the serial input signal DIN. When the CDR output clock signal CLK is early, the loop filter 108 and the clock selector 104 cooperate to retard subsequent cycles of the CDR output clock signal CLK. When the CDR output clock signal CLK is late, the loop filter 108 and the clock selector 104 cooperate to advance subsequent cycles of the CDR output clock signal CLK.

The loop filter 108 receives the phase comparison signal from the phase detector 106 and produces the phase control signal PHASE. The loop filter 108 effectively applies a transfer function from the phase comparison signal to produce the phase control signal PHASE so that the second timing loop has an appropriate response for locking to or tracking the serial input signal DIN. That is, the clock selector 104, the phase detector 106, and the loop filter 108, in combination, result in a CDR output clock signal CLK that is synchronized with the serial input signal DIN and values in the output data signal DOUT substantially match the values contained in the serial input signal DIN. In some embodiments, the transfer function of the loop filter 108 is a low pass filter and may have integral and proportional components.

Figure 2:
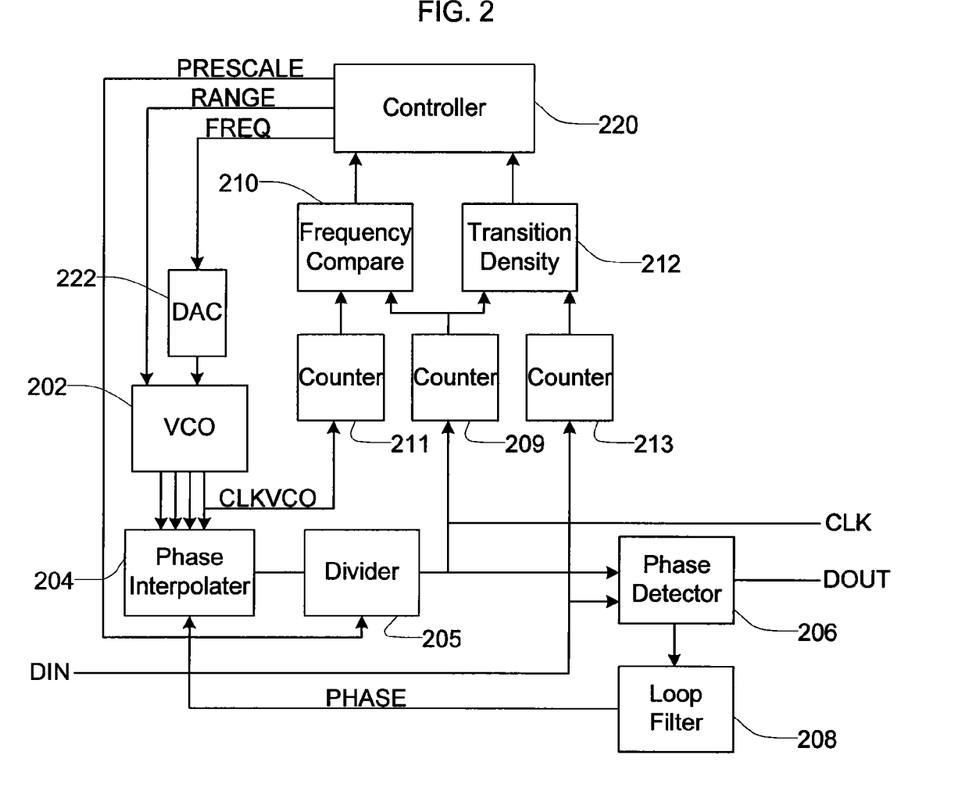
FIG. 2 is a block diagram of a clock and data recovery circuit in accordance with aspects of the invention.

FIG. 2 is a block diagram of a clock and data recovery circuit in accordance with aspects of the invention. The CDR receives a serial input signal DIN that conveys a sequential stream of data and produces an output data signal DOUT and an associated CDR output clock signal CLK. The CDR operates to produce the output data signal DOUT so that values in the output data signal DOUT substantially match values used to produce the serial input signal DIN and to produce the CDR output clock signal CLK synchronized with the output data signal DOUT. The CDR is similar to the CDR described above with reference to FIG. 1 and includes a first timing loop and a second timing loop.

The first timing loop includes, in an embodiment illustrated in FIG. 2, a voltage-controlled oscillator 202 that produces, based on signals from a controller 220, a VCO clock signal CLKVCO having a plurality of phases. A phase interpolator 204 receives the VCO clock signal CLKVCO and a phase control signal PHASE from the second timing loop and supplies a clock signal to a prescaler 205. The prescaler 205 divides the clock signal from the phase interpolator 204 based on a prescaler control signal PRESCALE from the controller 220 to produce the CDR output clock signal CLK. The first timing loop also includes first, second, and third counters 209, 211, 213 that count transitions of the CDR output clock signal CLK, the VCO clock signal CLKVCO, and the serial input signal DIN, respectively. A frequency comparator 210 and a transition density detector 212 utilize counts from the first, second, and third counters 209, 211, 213 to produce measurements for the controller 220 to utilize. The controller 220 supplies a frequency control signal FREQ via a digital-to-analog converter 222 and a range control signal RANGE to the voltage-controlled oscillator 202 and the prescaler control signal PRESCALE to the prescaler 205.

The second timing loop includes the phase interpolator 204 and the prescaler 205, which are also included in the first timing loop. A loop filter 208 supplies the phase control signal PHASE to the phase interpolator 204 by filtering phase comparisons of the CDR output clock signal CLK and the serial input signal DIN received from a phase detector 206. The phase detector 206 receives the serial input signal DIN and the CDR output clock signal CLK and additionally produces the output data signal DOUT.

In more detail, the voltage-controlled oscillator 202 receives an analog control signal from the digital-to-analog convertor 222 and the range control signal RANGE from the controller 220 and produces the VCO clock signal CLKVCO. The VCO clock signal CLKVCO has a plurality of phases, for example, four phases separated by 90°. The VCO clock signal CLKVCO oscillates at a frequency based on the analog control signal and the range control signal RANGE. The voltage-controlled oscillator 202 uses the range control signal RANGE to select from a plurality of frequency ranges, and the voltage-controlled oscillator 202 uses the analog control signal to set a frequency with the selected range. In one embodiment, the analog control signal is a voltage signal and is used, for example, to change a capacitance in the voltage-controlled oscillator 202 and thereby change the frequency of the VCO clock signal CLKVCO. In one embodiment, the voltage-controlled oscillator 202 includes a plurality of circuit elements, for example, inductors, and the range control signal RANGE is used to select which of the plurality of circuit elements will be used to produce the VCO clock signal CLKVCO.

The digital-to-analog convertor 222 receives the frequency control signal FREQ from the controller 220 and a produces the analog control signal for the voltage-controlled oscillator 202. The analog control signal is an analog representation, for example, a voltage or current, of a digitally coded value in the frequency control signal FREQ.

The phase interpolator 204 receives the VCO clock signal CLKVCO having a plurality of phases and the phase control signal PHASE and produces an interpolated clock signal. In one embodiment, the phase interpolator 204 produces the interpolated clock signal by selecting one of the phases of the VCO clock signal CLKVCO. In other embodiments, the phase interpolator 204 produces the interpolated clock signal by interpolating between two selected phases of the VCO clock signal CLKVCO. The phase control signal PHASE may change on a regular basis, for example, every period of the CDR output clock signal CLK.

The prescaler 205 receives the interpolated clock signal from the phase interpolator 204 and the prescaler control signal PRESCALE from the controller 220 and produces the CDR output clock signal CLK. The prescaler 205 may produce the CDR output clock signal CLK by dividing the interpolated clock signal by the value of the prescaler control signal PRESCALE. That is, the period of the CDR output clock signal CLK has a period that is the period of the interpolated clock signal times the value of the prescaler control signal PRESCALE. The value of prescaler control signal PRESCALE remains constant for at least one period, and much longer in many embodiments, of the CDR output clock signal CLK. In one embodiment, the prescaler 205 is limited to dividing by one, and the interpolated clock signal and the CDR output clock signal CLK have the same period.

The first counter 209 receives the CDR output clock signal CLK and produces a count of cycles of the CDR output clock signal CLK. In one embodiment, the first counter 209 counts from zero to a set value, for example, 4095, and then begins counting anew from zero.

The second counter 211 receives the VCO clock signal CLKVCO and produces a count of cycles of the VCO clock signal CLKVCO. In one embodiment, the second counter 211 counts cycles of the VCO clock signal CLKVCO over an interval of the first counter 209. For example, the second counter 211 may set a count to zero when the first counter 209 reaches a count value of zero and then count cycles of the VCO clock signal CLKVCO until the first counter 209 again reaches a count value of zero.

The third counter 213 receives the serial input signal DIN and produces a count of cycles of the serial input signal DIN. In one embodiment, the third counter 213 counts cycles of the serial input signal DIN over an interval of the first counter 209. For example, the third counter 213 may set a count to zero when the first counter 209 reaches a count value of zero and then counts cycles of the serial input signal DIN until the first counter 209 again reaches a count value of zero. In another embodiment, the third counter 213 counts both rising and fall edges of the serial input signal DIN.

The frequency comparator 210 receives the counts from the first counter 209 and the second counter 211 and produces the frequency comparison measurement for use by the controller 220. Since the first counter 209 counts cycles of the CDR output clock signal CLK and the second counter 211 counts cycles of the VCO clock signal CLKVCO, the frequency comparator 210 may the use the counts to produce a comparison of the frequencies of the CDR output clock signal CLK and the VCO clock signal CLKVCO. In one embodiment, the frequency comparison measurement is the ratio of the counts. When the second timing loop is locked to the serial input signal DIN, the frequency comparison measurement is a measure of the frequency of the VCO clock signal CLKVCO relative to the data rate of the serial input signal DIN.

The transition density detector 212 receives the counts from the first counter 209 and the third counter 213 and produces and produces the transition density measurement for use by the controller 220. Since the first counter 209 counts cycles of the CDR output clock signal CLK and the third counter 213 counts cycles of the serial input signal DIN, the transition density detector 212 may use the counts to produce an indication of the transition density of the serial input signal DIN relative to the frequency of the CDR output clock signal CLK. In one embodiment, the transition density measurement is twice the count from the third counter 213 divided by the count from the first counter 209.

The controller 220 adjusts the frequency of the voltage-controlled oscillator 202 and the divide rate of the prescaler 205 based on the frequency comparison measurement and the transition density measurement. The controller 220 is similar to the controller 120 of the embodiment of FIG. 1. In some embodiments, the controller 220 may receive additional signals, for example, a loss-of-signal indicator or reset signal. The controller 220 operates to determine a setting of values for the prescale control signal PRESCALE, the range control signal RANGE, and the frequency control signal FREQ at which the second timing loop locks to the incoming data. The controller 220 may determine that the second timing loop is locked to the incoming data when the value of the transition density measurement is close to a statistically expected value or a preset value. In some embodiments, the controller 220 additionally operates to determine the setting of values that results in CDR operation close to the center point of the adjustment range of the second timing loop. The controller 220 may use the value of the frequency comparison measurement to judge closeness to the center point. For example, the controller 220 may determine that the second timing loop is operating close to the center point when the frequency comparison measurement is within ten percent of the prescale value.

The controller 220, in one embodiment, initially searches for a setting of values that results in desired frequency comparison and transition density values by sweeping the prescale control signal PRESCALE, the range control signal RANGE, and the frequency control signal FREQ through ranges of possible values. In one embodiment, the controller 220 uses a nested do-loop scheme to find the desired setting of values. In another embodiment, the controller 220 uses successive approximation to find the desired setting of values. The desired setting of values is one that results in the CDR locking to the input signal and the second timing loop operating near the center of its operating range.

The controller 220 may additionally track the serial input signal to maintain lock to the serial input signal. In some embodiments, the tracking is similar to or the same as the tracking described above with reference to FIG. 1.

The controller 220 may additionally hold values of the prescale control signal PRESCALE, the range control signal RANGE, and the frequency control signal FREQ in response to interruptions in the serial input signal. In some embodiments, the holding is similar to or the same as the holding described above with reference to FIG. 1.

The phase detector 206 receives the serial input signal DIN and the CDR output clock signal CLK and produces the output data signal DOUT and a phase comparison signal. In some embodiments, the phase detector 206 is similar to or the same as the phase detector 106 of the CDR of FIG. 1.

The loop filter 208 receives the phase comparison signal from the phase detector 206 and produces the phase control signal PHASE. The loop filter 208 effectively applies a transfer function from the phase comparison signal to produce the phase control signal PHASE so that the second timing loop has an appropriate response for locking to or tracking the serial input signal DIN. That is, the phase interpolator 204, the prescaler 205, the phase detector 206, and the loop filter 208, in combination, result in a CDR output clock signal CLK that is synchronized with the serial input signal DIN and values in the output data signal DOUT substantially match the values contained in the serial input signal DIN. In some embodiments, the loop filter 208 is similar to or the same as the loop filter 108 of the embodiment of FIG. 1.

Figure 3:
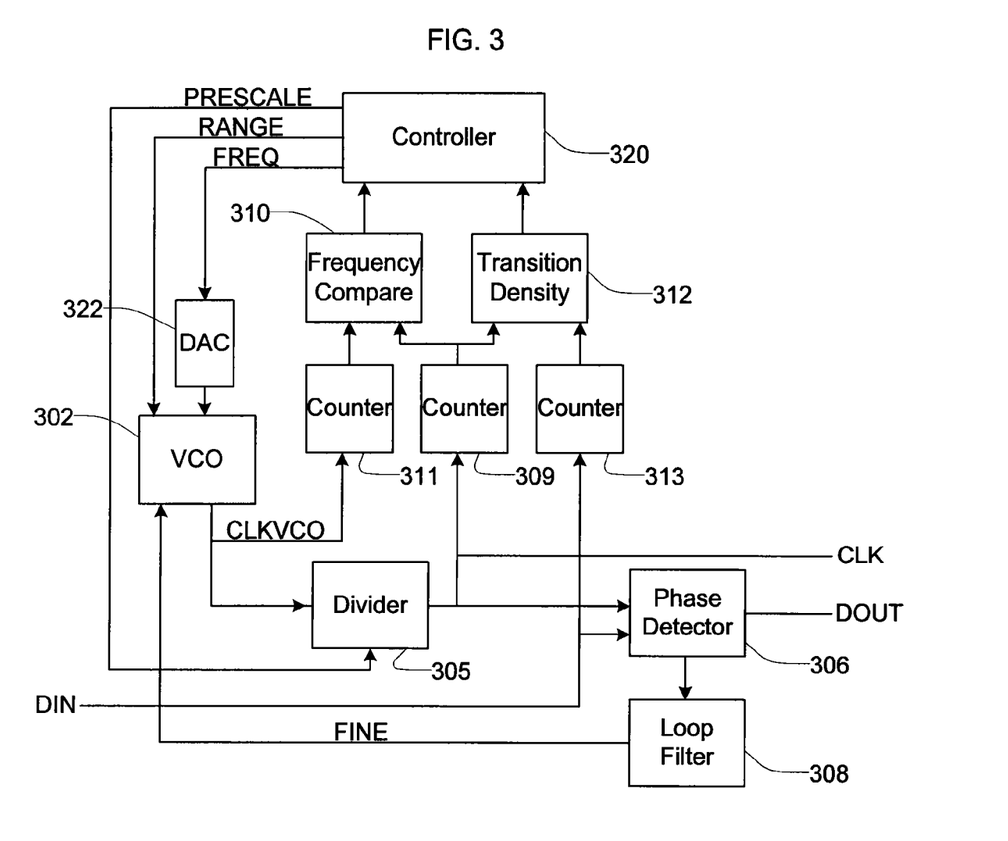
FIG. 3 is a block diagram of a clock and data recovery circuit in accordance with aspects of the invention.

FIG. 3 is a block diagram of a clock and data recovery circuit in accordance with aspects of the invention. The CDR is similar to the CDR of FIG. 2. The CDR receives a serial input signal DIN that conveys a sequential stream of data and produces an output data signal DOUT and an associated CDR output clock signal CLK. The CDR operates to produce the output data signal DOUT so that values in the output data signal DOUT substantially match values used to produce the serial input signal DIN and to produce the CDR output clock signal CLK synchronized with the output data signal DOUT. The CDR includes a first timing loop and a second timing loop.

The first timing loop includes, in an embodiment illustrated in FIG. 3, a voltage-controlled oscillator 302 that produces, based on signals from a controller 320 and a fine tuning signal FINE from the second loop, a VCO clock signal CLKVCO. A prescaler 305 divides the VCO clock signal CLKVCO based on a prescaler control signal PRESCALE from the controller 320 to produce the CDR output clock signal CLK. The first timing loop also includes first, second, and third counters 309, 311, 313 that count transitions of the CDR output clock signal CLK, the VCO clock signal CLKVCO, and the serial input signal DIN, respectively. A frequency comparator 310 and a transition density detector 312 utilize counts from the first, second, and third counters 309, 311, 313 to produce measurements for the controller 320 to utilize. The controller 320 supplies a frequency control signal FREQ via a digital-to-analog converter 322 and a range control signal RANGE to the voltage-controlled oscillator 302 and the prescaler control signal PRESCALE to the prescaler 305.

The second timing loop includes the voltage-controlled oscillator 302 and the prescaler 305, which are also included in the first timing loop. A loop filter 308 supplies the fine tuning signal FINE to the voltage-controlled oscillator 302 by filtering phase comparisons of the CDR output clock signal CLK and the serial input signal DIN received from a phase detector 306. The phase detector 306 receives the serial input signal DIN and the CDR output clock signal CLK and additionally produces the output data signal DOUT.

In more detail, the voltage-controlled oscillator 302 receives an analog control signal from the digital-to-analog convertor 222, the range control signal RANGE from the controller 220, and the fine tuning signal FINE from the loop filter 308 and produces the VCO clock signal CLKVCO. The voltage-controlled oscillator 302 uses the range control signal RANGE to select from a plurality of frequency ranges. The voltage-controlled oscillator 302 additionally uses the analog control signal to set a frequency with the selected range. The voltage-controlled oscillator 302 uses the fine tuning signal FINE to make further small adjustments of the frequency of the VCO clock signal CLKVCO. In one embodiment, the analog control signal and the fine tuning signal FINE are voltage signals and are used, for example, to change capacitances in the voltage-controlled oscillator 302 and thereby change the frequency of the VCO clock signal CLKVCO. The frequency change of the VCO clock signal CLKVCO is substantially greater for a given change in the analog control signal than for the same change in the fine tuning signal FINE. For example, the voltage-controlled oscillator 302 may have a gain of 2 GHz/V with respect to the analog control signal and a gain of 100 MHz/V with respect to the fine tuning signal FINE. In one embodiment, the voltage-controlled oscillator 302 includes a plurality of circuit elements, for example, inductors, and the range control signal RANGE is used to select which of the plurality of circuit elements will be used to produce the VCO clock signal CLKVCO.

The digital-to-analog convertor 322 receives the frequency control signal FREQ from the controller 320 and a produces the analog control signal for the voltage-controlled oscillator 302. The analog control signal is an analog representation, for example, a voltage or current, of a digitally coded value in the frequency control signal FREQ.

The prescaler 305 receives the VCO clock signal CLKVCO and the prescaler control signal PRESCALE from the controller 320 and produces the CDR output clock signal CLK. The prescaler 305 may produce the CDR output clock signal CLK by dividing the VCO clock signal CLKVCO by the value of the prescaler control signal PRESCALE. That is, the period of the CDR output clock signal CLK has a period that is the period of the VCO clock signal CLKVCO times the value of the prescaler control signal PRESCALE. The value of prescaler control signal PRESCALE remains constant for at least one period, and much longer in many embodiments, of the CDR output clock signal CLK. In one embodiment, the prescaler 305 is limited to dividing by one and the VCO clock signal CLKVCO and the CDR output clock signal CLK have the same period.

The first counter 309 receives the CDR output clock signal CLK and produces a count of cycles of the CDR output clock signal CLK. In one embodiment, the first counter 309 counts from zero to a set value, for example, 4095, and then begins counting anew from zero.

The second counter 311 receives the VCO clock signal CLKVCO and produces a count of cycles of the VCO clock signal CLKVCO. In one embodiment, the second counter 311 counts cycles of the VCO clock signal CLKVCO over an interval of the first counter 309. For example, the second counter 311 may set a count to zero when the first counter 309 reaches a count value of zero and then count cycles of the VCO clock signal CLKVCO until the first counter 309 again reaches a count value of zero.

The third counter 313 receives the serial input signal DIN and produces a count of cycles of the serial input signal DIN. In one embodiment, the third counter 313 counts cycles of the serial input signal DIN over an interval of the first counter 309. For example, the third counter 313 may set a count to zero when the first counter 309 reaches a count value of zero and then counts cycles of the serial input signal DIN until the first counter 309 again reaches a count value of zero. In another embodiment, the third counter 313 counts both rising and fall edges of the serial input signal DIN.

The frequency comparator 310 receives the counts from the first counter 309 and the second counter 311 and produces the frequency comparison measurement for use by the controller 320. Since the first counter 309 counts cycles of the CDR output clock signal CLK and the second counter 311 counts cycles of the VCO clock signal CLKVCO, the frequency comparator 310 may the use the counts to produce a comparison of the frequencies of the CDR output clock signal CLK and the VCO clock signal CLKVCO. In one embodiment, the frequency comparison measurement is the ratio of the counts. When the second timing loop is locked to the serial input signal DIN, the frequency comparison measurement is a measure of the frequency of the VCO clock signal CLKVCO relative to the data rate of the serial input signal DIN.

The transition density detector 312 receives the counts from the first counter 309 and the third counter 313 and produces and produces the transition density measurement for use by the controller 320. Since the first counter 309 counts cycles of the CDR output clock signal CLK and the third counter 313 counts cycles of the serial input signal DIN, the transition density detector 312 may use the counts to produce an indication of the transition density of the serial input signal DIN relative to the frequency of the CDR output clock signal CLK. In one embodiment, the transition density measurement is twice the count from the third counter 313 divided by the count from the first counter 309.

The controller 320 adjusts the frequency of the voltage-controlled oscillator 302 and the divide rate of the prescaler 305 based on the frequency comparison measurement and the transition density measurement. In some embodiments, the controller 320 may receive additional signals, for example, a loss-of-signal indicator or reset signal. The controller 320 operates to determine a setting of values for the prescale control signal PRESCALE, the range control signal RANGE, and the frequency control signal FREQ at which the second timing loop locks to the incoming data. The controller 320 may determine that the second timing loop is locked to the incoming data when the value of the transition density measurement is close to the statistically expected value. In some embodiments, the controller 320 additionally operates to determine the setting of values that results in CDR operation close to the center point of the adjustment range of the second timing loop. The controller 320 may use the value of the frequency comparison measurement to judge closeness to the center point. For example, the controller 320 may determine that the second timing loop is operating close to the center point when the frequency comparison measurement is within ten percent of the prescale value.

The controller 320, in one embodiment, initially searches for a setting of values that results in desired frequency comparison and transition density values by sweeping the prescale control signal PRESCALE, the range control signal RANGE, and the frequency control signal FREQ through ranges of possible values. In one embodiment, the controller 320 uses a nested do-loop scheme to find the desired setting of values. In another embodiment, the controller 320 uses successive approximation to find the desired setting of values. The desired setting of values is one that results in the CDR locking to the input signal and the second timing loop operating near the center of its operating range.

The controller 320 may additionally track the serial input signal to maintain lock to the serial input signal. In some embodiments, the tracking is similar to or the same as the tracking described above with reference to FIGS. 1 and 2.

The controller 320 may additionally hold values of the prescale control signal PRESCALE, the range control signal RANGE, and the frequency control signal FREQ in response to interruptions in the serial input signal. In some embodiments, the holding is similar to or the same as the holding described above with reference to FIGS. 1 and 2.

The phase detector 306 receives the serial input signal DIN and the CDR output clock signal CLK and produces the output data signal DOUT and a phase comparison signal. In some embodiments, the phase detector 306 is similar to or the same as the phase detector 206 of the CDR of FIG. 2.

The loop filter 308 receives the phase comparison signal from the phase detector 306 and produces the fine tune signal FINE. The loop filter 308 effectively applies a transfer function from the phase comparison signal to produce the fine tune signal FINE so that the second timing loop has an appropriate response for locking to or tracking the serial input signal DIN. That is, the voltage-controlled oscillator 302, the prescaler 305, the phase detector 306, and the loop filter 308, in combination, result in a CDR output clock signal CLK that is synchronized with the serial input signal DIN and values in the output data signal DOUT substantially match the values contained in the serial input signal DIN.

Figure 4:
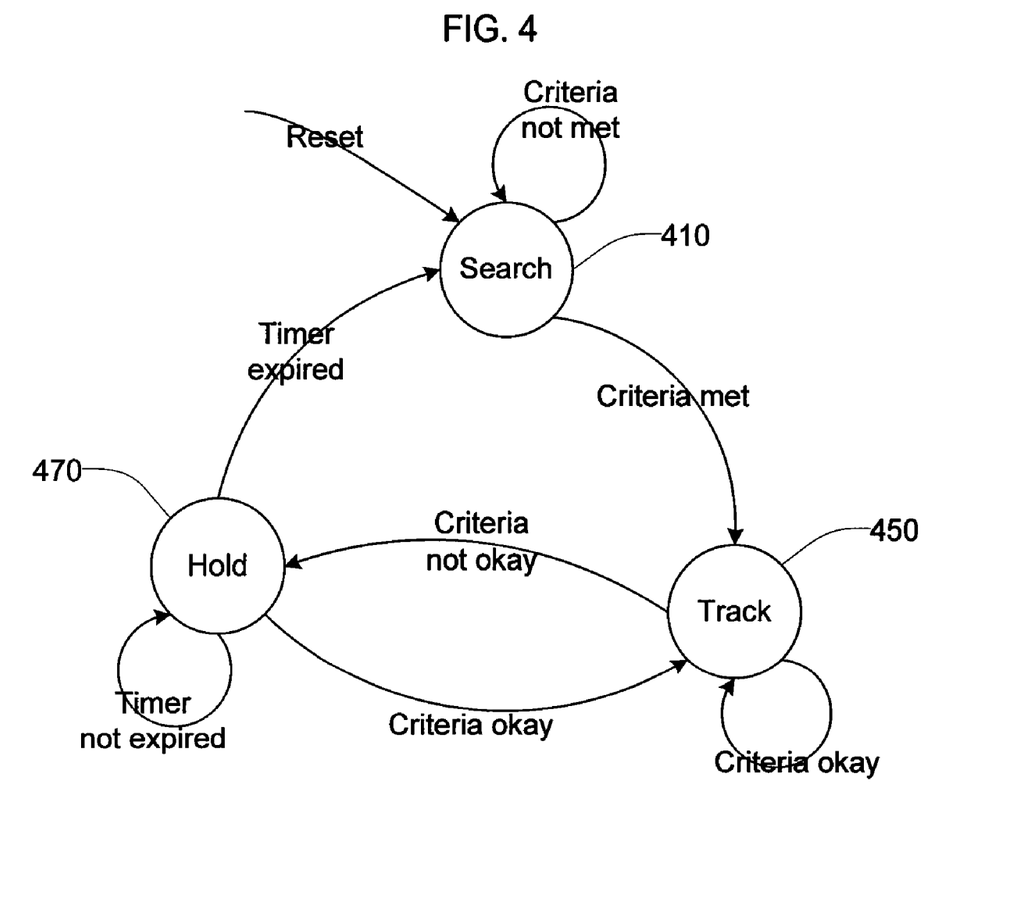
FIG. 4 is a state diagram of a process for clock and data recovery in accordance with aspects of the invention.

FIG. 4 is state diagram of a process for clock and data recovery in accordance with aspects of the invention. The process may be performed by a CDR, such as one of the CDRs described above with reference to FIG. 1, 2, or 3. The process receives a serial input signal and produces an output data signal and an associated clock signal. In some embodiments, the process may receive additional signals, such as a reset signal or a loss-of-signal indicator. In some embodiments, the process produces status signals indicating, for example, what state the process is in.

The CDR process, as illustrated in FIG. 4, includes a search state 410, a track state 450, and a hold state 470. In the search state 410, the CDR process searches for circuit settings that result in met locking criteria. In some embodiments, the CDR process searches by sweeping settings through ranges of values. Meeting the locking criteria indicates that the CDR process has locked onto the serial input signal and is producing corresponding output data and clock signals. The CDR process remains in the search state 410 until the locking criteria are met. When locking criteria are met, the CDR process transitions to the track state 450. The CDR process may enter the search state 410 on assertion of a reset signal, when present in an embodiment.

In the track state 450, the CDR process continues measuring the locking criteria. In some embodiments, the CDR process may adjust the circuit settings based on the locking criteria. For example, the CDR process may raise an oscillator frequency when the data rate of the received signal is higher than expected. The CDR process remains in the track state 450 while the locking criteria are met. When locking criteria are not met, the CDR process transitions to the hold state 470. The locking criteria may not be met due to, for example, an interruption in the serial input signal.

In the hold state 470, the CDR process holds the circuit settings fixed and continues measuring the locking criteria. Upon entering the hold state 470, the CDR process may begin a timer. When the timer exceeds a limit, for example, one millisecond, the CDR process transitions to the search state 410. When the locking criteria are met, the CDR process transitions to the track state 450. Otherwise, the CDR process continues in the hold state 470. The CDR process may also remain in the hold state 470 based on assertion of a loss-of-signal indicator, when present in an embodiment.

Figure 5:
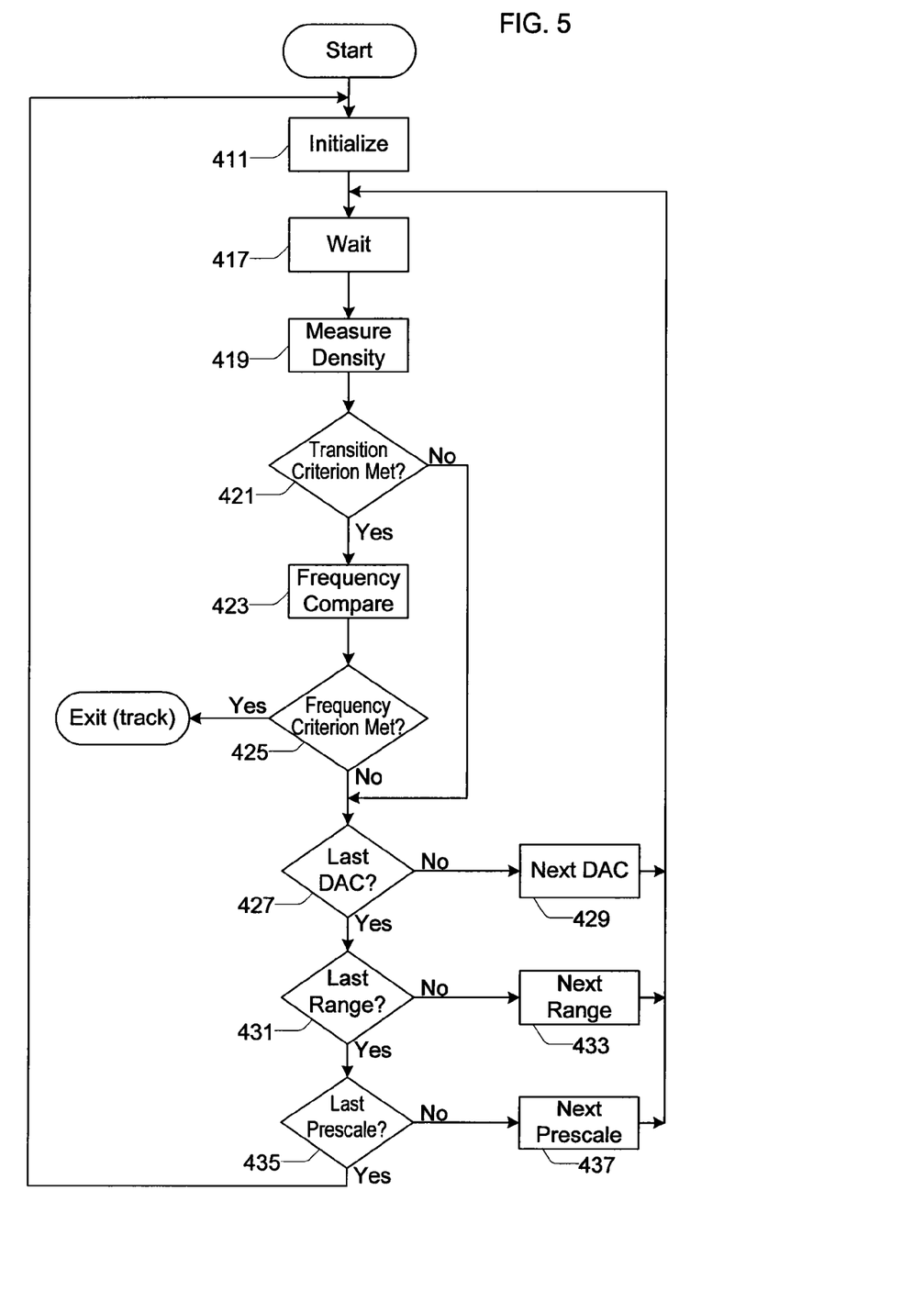
FIG. 5 is a flowchart of a process for clock and data recovery in accordance with aspects of the invention.

FIG. 5 is a flowchart of an embodiment of a search process for clock and data recovery in accordance with aspects of the invention. The search process may be performed by the controller of FIG. 2 or other circuitry, for example. The search process may also be performed in the search state 410 of the CDR process of FIG. 4. The search process produces a prescale setting, a range setting, and a DAC setting. Each of the settings has a range of discrete possible values. The prescale, range, and DAC settings may correspond to the prescale control signal PRESCALE, the range control signal RANGE, and the DAC control signal FREQ, respectively, of the CDR described above with reference to FIG. 2. The search process generally loops through the ranges of values for the prescale, range, and DAC settings in nested sequential order until a desired operating point is reached.

In block 411 the search process initializes the prescale, range, and DAC settings by setting each to the first value in their respect range of values. In some embodiments, the first prescale value is the minimum or maximum of the range of possible values for the prescale setting; the first range value is the minimum or maximum of the range of possible values for the range setting; and the first DAC value is the minimum or maximum of the range of possible values for the DAC setting. The search process then continues to block 417.

In block 417, the search process waits a time interval. The wait time may be a number of cycles of a CDR output clock signal, for example, 32,768 cycles. The wait time allows circuitry affected by the prescale, range, and DAC settings to reach stable states, if possible for the values of the settings. The search process then continues to block 419.

In block 419, the search process measures a data transition density. The data transition density is a measure of the rate of transitions on a serial input signal of the CDR relative to the CDR output clock signal. In one embodiment, the data transition density is measured by counting serial input data edges over a number, for example, 4096, of cycles of the CDR output clock signal. The search process then continues to block 421. In some embodiments, the data transition density measurement is performed at the same time or overlapping in time with the wait of block 417.

In block 421, the search process tests whether the data transition density measured in block 419 meets a criterion. The criterion may be a range, for example, in a search process expecting a data transition density of 0.65, the criterion may be met with when the measured data transition density is between 0.45 and 0.85. If the data transition density meets the criterion, the search process continues to block 423; otherwise, the search process continues to block 427.

In block 423, the search process measures a frequency comparison. The frequency comparison is a measure of how close the operating rate of a portion of the CDR is to the center of the range of operating rates of the portion. In some embodiments, the frequency comparison is a measure of the frequency of a clock signal from a first timing loop relative to the frequency of a clock signal from a second timing loop. The first and second timing loops may be, for example, the first and second timing loops, respectively, of the CDR described above with reference to FIG. 2. In one embodiment, the frequency comparison is measured by counting the number of cycles of the clock signal from the first CDR timing loop over a number, for example, 4096, of cycles of the clock signal from the second CDR timing loop. The search process then continues to block 425. In some embodiments, the frequency comparison is performed at the same time or overlapping in time with the transition density measurement of block 419.

In block 425, the search process tests whether the frequency comparison meets a criterion. The criterion may be a range, for example, 0.9 to 1.1. In an embodiment that performs the frequency comparison by counting cycles of the clock signal from the first timing loop over 4096 cycles of the clock signal from the second timing loop, the criterion may be met by frequency comparison values between 3686 and 4505. The range may depend on the values of some of the settings, for example, the range may be scaled by the value of the prescale setting. If the frequency comparison meets the criterion, the search process exits; otherwise, the search process continues to block 427. In an embodiment where the search process is performed in the search state 410 of the CDR process of FIG. 4, the search process may exit to the track state 450 of the CDR process.

In block 427, the search process checks whether the value of the DAC setting equals the last of the DAC setting values. If the value of the DAC setting equals the last of the DAC setting values, the search process sets the DAC setting to the first DAC value and continues to block 431; otherwise, the search process continues to block 429.

In block 429, the search process sets the DAC setting to a next DAC value. In an embodiment that sets, in block 411, the first DAC value to the minimum of the range of possible values for the DAC setting, the next DAC value may be an increment of the previous DAC value. In an embodiment that sets, in block 411, the first DAC value to the maximum of the range of possible values for the DAC setting, the next DAC value may be a decrement of the previous DAC value. The search process then returns to block 417.

In block 431, the search process tests whether the value of the range setting equals the last of the range setting values. If the value of the range setting equals the last of the range setting values, the search process sets the range setting to the first range value and continues to block 435; otherwise, the search process continues to block 433.

In block 433, the search process sets the range setting to a next range value. In an embodiment that sets, in block 411, the first range value to the minimum of the range of possible values for the range setting, the next range value may be an increment of the previous range value. In an embodiment that sets, in block 411, the first range value to the maximum of the range of possible values for the range setting, the next range value may be a decrement of the previous range value. The search process then returns to block 417.

In block 435, the search process tests whether the value of the prescale setting equals the last of the prescale setting values. If the value of the prescale setting equals the last of the prescale setting values, the search process returns to block 411; otherwise, the search process continues to block 437.

In block 437, the search process sets the prescale setting to a next prescale value. In an embodiment that sets, in block 411, the first prescale value to the minimum of the prescale of possible values for the prescale setting, the next prescale value may be an increment of the previous prescale value. In an embodiment that sets, in block 411, the first prescale value to the maximum of the range of possible values for the prescale setting, the next range value may be a decrement of the previous prescale value. The search process then returns to block 417.

Figure 6:
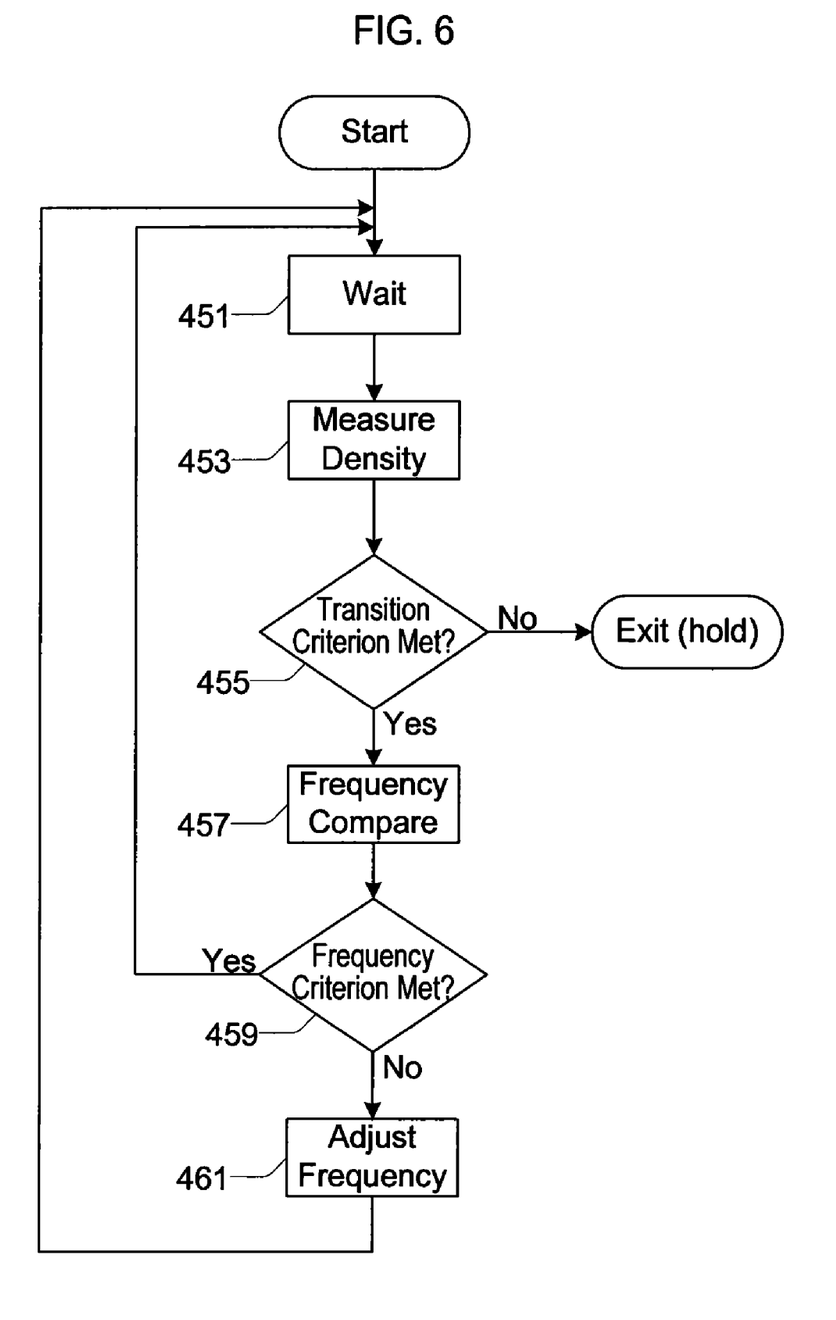
FIG. 6 is a flowchart of a process for clock and data recovery in accordance with aspects of the invention.

FIG. 6 is a flowchart of an embodiment of a track process for clock and data recovery in accordance with aspects of the invention. The track process may be performed by the controller of FIG. 2 or other circuitry, for example. The track process may also be performed in the track state 450 of the CDR process of FIG. 4. The track process monitors that clock and data are being successfully recovered and may adjust settings to track timing changes in a serial input signal.

In block 451, the track process waits a time interval. The wait time may be a number of cycles of a CDR output clock signal, for example, 32,768 cycles. The wait time allows for CDR circuitry to reach stable states, if possible for the values of the settings. The track process then continues to block 453.

In block 453, the track process measures a data transition density. The measurement may be performed as described above for block 419 of the search process of FIG. 5. The track process then continues to block 455.

In block 455, the track process tests whether the data transition density meets a criterion. The criterion may be tested in a manner analogous to that described above for block 421 of the search process of FIG. 5. However, even when the track process performs in conjunction with a search process, the data transition density criteria may be different for the track and search processes. If the data transition density meets the criterion, the track process continues to block 457; otherwise, the track process exits. In an embodiment where the track process is performed in the track state 450 of the CDR process of FIG. 4, the track process may exit to the hold state 470 of the CDR process.

In block 457, the track process measures a frequency comparison. The frequency comparison may be performed as described above for block 423 of the search process of FIG. 5. The track process then continues to block 459.

In block 459, the track process tests whether the frequency comparison meets a criterion. The criterion may be tested in a manner analogous to that described above for block 425 of the search process of FIG. 5. However, even when the track process performs in conjunction with a search process, the frequency comparison criteria may be the different for the track and search processes. If the frequency comparison meets the criterion, the track process returns to block 451; otherwise, the track process continues to block 461.

In block 461, the track process adjusts a frequency setting. The adjustment depends on the measured frequency comparison. When the frequency of circuits affected by the value of the frequency setting is too high, the frequency setting is adjusted to produce a lower frequency. When the frequency of circuits affected by the value of the frequency setting is too low, the frequency setting is adjusted to produce a higher frequency. The track process then returns to block 451.

Figure 7:
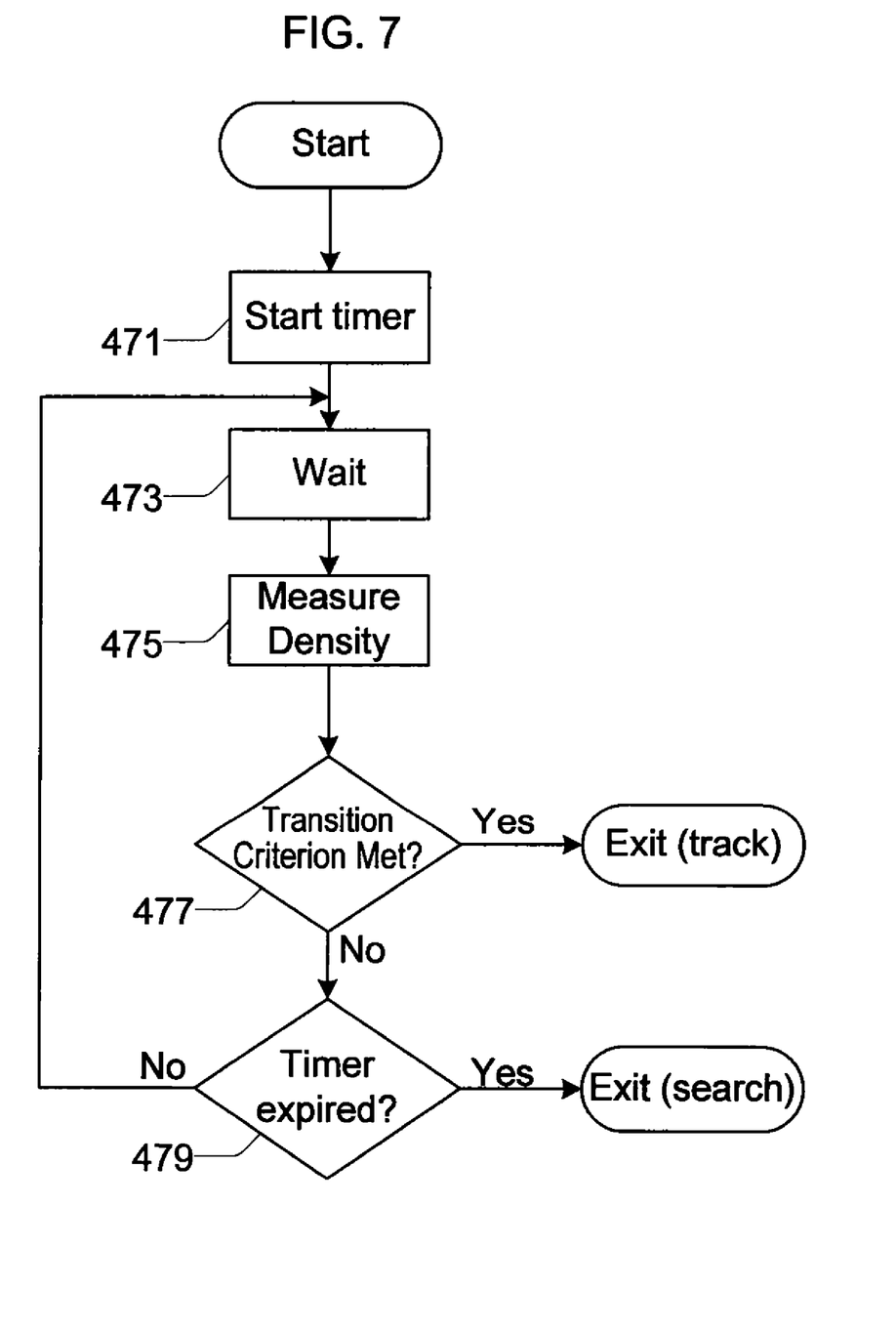
FIG. 7 is a flowchart of a process for clock and data recovery in accordance with aspects of the invention.

FIG. 7 is a flowchart of an embodiment of a hold process for clock and data recovery in accordance with aspects of the invention. The hold process may be performed by the controller of FIG. 2 or other circuitry, for example. The hold process may also be performed in the hold state 470 of the CDR process of FIG. 4. The hold process may hold control settings stable in the event of a signal interruption and wait for signal return.

In block 471, the hold process starts a timer. The timer may expire, for example, in one millisecond. The hold process then continues to block 473. In an embodiment with a loss-of-signal indicator, the timer may be restarted based on indication of signal loss.

In block 473, the hold process waits a time interval. The wait time may be a number of cycles of a CDR output clock signal, for example, 32,768 cycles. The hold process then continues to block 475.

In block 475, the hold process measures a data transition density. The measurement may be performed as described above for block 419 of the search process of FIG. 5 or block 453 of the track process of FIG. 6. The hold process then continues to block 477.

In block 477, the hold process tests whether the data transition density meets a criterion. The criterion may be tested in manner analogous to that described above for block 421 of the search process of FIG. 5 or block 455 of the track process of FIG. 6. However, even when the hold process performs in conjunction with a search process or a track process, the data transition criteria may be the different for the hold, track, and search processes. If the data transition density meets the criterion, the hold process exits; otherwise, the hold process continues to block 479. In an embodiment where the hold process is performed in the hold state 470 of the CDR process of FIG. 4, the hold process may exit to the track state 480 of the CDR process.

In block 479, the hold process tests whether the timer started in block 471 has expired. If the timer has expired, the hold process exits; otherwise, the hold process returns to block 473. In an embodiment where the hold process is performed in the hold state 470 of the CDR process of FIG. 4, the search process may exit to the search state 410 of the CDR process.

Although the invention has been discussed with respect to various embodiments, it should be understood the invention comprises the novel and unobvious claims, and their insubstantial variations, supported by this disclosure.

The invention claimed is:

1. A clock and data recovery device, comprising:
   an oscillator configured to produce a first clock signal in response to a frequency control signal;
   clock circuitry configured to receive the first clock signal and produce an output clock signal based on a phase control signal;
   a phase detector configured to receive a data input signal and the output clock signal and produce a data output signal and a phase detection signal;
   a loop filter configured to produce the phase control signal by filtering the phase detection signal;
   a controller configured to control the frequency of the oscillator using the frequency control signal based on measurements of the first clock signal, the output clock signal, and the data input signal;

wherein the clock circuitry comprises:
a phase interpolator configured to receive the first clock signal and produce a second clock signal based on the phase control signal, where the second clock signal is interpolated from two phases of a plurality of phases of the first clock signal;
a prescaler configured to receive the second clock signal and produce the output clock signal by dividing the second clock signal by a value of a prescaler control signal produced by the controller.

2. A clock and data recovery device, comprising:
an oscillator configured to produce a first clock signal in response to a frequency control signal;
clock circuitry configured to receive the first clock signal and produce an output clock signal based on a phase control signal;
a phase detector configured to receive a data input signal and the output clock signal and produce a data output signal and a phase detection signal;
a loop filter configured to produce the phase control signal by filtering the phase detection signal;
a controller configured to control the frequency of the oscillator using the frequency control signal based on measurements of the first clock signal, the output clock signal, and the data input signal;
further comprising a transition density detector coupled to the output clock signal and the data input signal and configured to produce a transition density signal indicative of the transition density of the data input signal relative to the frequency of the output clock signal, and wherein the measurements comprise the transition density signal; and
further comprising a frequency comparator coupled to the first clock signal and the output clock signal and configured to produce a frequency comparison signal indicative of the relative frequencies of the first clock signal and the output clock signal, and wherein the measurements further comprise the frequency comparison signal.

3. A clock and data recovery device, comprising:
an oscillator configured to produce a first clock signal having a plurality of phases with an oscillation frequency based on a frequency control signal and a range control signal;
a controller configured to produce the frequency control signal, the range control signal, and a prescaler control signal based on a frequency comparison measure and a data transition density measure;
a phase interpolator configured to receive the first clock signal and produce a second clock signal based on a phase control signal, where the second clock signal is interpolated from two phases of the plurality of phases of the first clock signal;
a prescaler configured to receive the second clock signal and produce an output clock signal by dividing the second clock signal by a value of the prescaler control signal;
a phase detector configured to receive a data input signal and the output clock signal and produce a data output signal and a phase detection signal;
a loop filter configured to produce the phase control signal by filtering the phase detection signal;
a frequency comparison module configured to produce the frequency comparison measure based on relative frequencies of the first clock signal and the output clock signal; and
a transition density detector configured to produce the data transition density measure based on relative frequencies of the data input signal and the output clock signal.

4. The clock and data recovery device of claim 3, further comprising:
a first counter coupled to the output clock signal and configured to produce counts of transitions of the output clock signal;
a second counter coupled to the first clock signal and configured to produce counts of transitions of the first clock signal; and
a third counter coupled to the data input signal and configured to produce counts of transitions of the data input signal, and
wherein the frequency comparison module receives the counts from the first counter and the second counter and transition density detector receives the counts from the first counter and the third counter.

5. The clock and data recovery device of claim 3, wherein the controller is further configured to search for a value of the frequency control signal that results in the measurements meeting lock criteria.

6. The clock and data recovery device of claim 5, wherein the controller is further configured to search by sweeping the frequency control signal through a range of values.

7. A clock and data recovery device, comprising:
an oscillator configured to produce a first clock signal in response to a first frequency control signal and second frequency control signal;
a divider configured to receive the first clock signal and produce an output clock signal;
a phase detector configured to receive a data input signal and the output clock signal and produce a data output signal and a phase detection signal;
a loop filter configured to produce the second frequency control signal by filtering the phase detection signal;
a controller configured to control the frequency of the oscillator using the first frequency control signal based on measurements of the first clock signal, the output clock signal, and the data input signal; and
wherein the controller configured is further configured to produce a prescaler control signal and the divider is further configured to produce the output clock signal by dividing the first clock signal by a value of the prescaler control signal.

8. A clock and data recovery device, comprising:
an oscillator configured to produce a first clock signal in response to a first frequency control signal and second frequency control signal;
a divider configured to receive the first clock signal and produce an output clock signal,
a phase detector configured to receive a data input signal and the output clock signal and produce a data output signal and a phase detection signal;
a loop filter configured to produce the second frequency control signal by filtering the phase detection signal;
a controller configured to control the frequency of the oscillator using the first frequency control signal based on measurements of the first clock signal, the output clock signal and the data input signal;
further comprising a transition density detector coupled to the output clock signal and the data input signal and configured to produce a transition density signal indicative of the transition density of the data input signal relative to the frequency of the output clock signal, and wherein the measurements comprise the transition density signal; and further comprising a frequency comparator coupled to the first clock signal and the output clock signal and configured to produce a frequency comparison signal indicative of the relative frequencies of the first clock signal and the output clock signal, and wherein the measurements further comprise the frequency comparison signal.

9. A method for clock and data recovery, comprising:
measuring a frequency comparison indicative of the relative frequencies of a first clock signal and an output clock signal;
measuring a data transition density indicative of transition density of a data input signal relative to the frequency of the output clock signal;
searching for circuit settings that allow locking of a digital clock and data recovery circuit to the data input signal, where the locking is based on the measured frequency comparison and the measured data transition density;
further comprising tracking the data input signal, where tracking the data input signal comprises adjusting the circuit settings of the digital clock and data recovery circuit to track a frequency of the data input signal and is performed after the searching meets a search criterion; and
further comprising holding the circuit settings of the digital clock and data recovery circuit, where the holding the circuit settings of the digital clock and data recovery circuit is performed after the tracking does not meet a tracking criterion.

10. A method for clock and data recovery, comprising:
measuring a frequency comparison indicative of the relative frequencies of a first clock signal and an output clock signal;
measuring a data transition density indicative of transition density of a data input signal relative to the frequency of the output clock signal;
searching for circuit settings that allow locking of a digital clock and data recovery circuit to the data input signal, where the locking is based on the measured frequency comparison and the measured data transition density
wherein the method is performed by circuitry including a clock and data recovery circuit with a prescaler and a voltage-controlled oscillator having a range control and a frequency control, and wherein the searching for circuit settings that allow locking of the digital clock and data recovery circuit to the data input signal comprises:
sweeping a prescale control through a range of prescale control values;
sweeping a range control through a range of range control values for each value of the prescale control; and
sweeping a frequency control through a range of frequency control values for each value of the range control until the measured data transition density meets a criterion.

* * * * *

UNITED STATES PATENT AND TRADEMARK OFFICE
CERTIFICATE OF CORRECTION

PATENT NO. : 8,284,888 B2
APPLICATION NO. : 12/687410
DATED : October 9, 2012
INVENTOR(S) : Ian Kyles It is certified that error appears in the above-identified patent and that said Letters Patent is hereby corrected as shown below:

In the Claims

In column 18, line 51, delete "signal," and insert --signal;--, therefor.

In column 18, line 60, after "clock signal" insert --,--, therefor.

Signed and Sealed this
Second Day of July, 2013

Teresa Stanek Rea
*Acting Director of the United States Patent and Trademark Office*